(12) United States Patent
Isono

(10) Patent No.: US 7,514,855 B2
(45) Date of Patent: Apr. 7, 2009

(54) PIEZOELECTRIC ACTUATOR AND METHOD FOR PRODUCING THE SAME

(75) Inventor: Jun Isono, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 11/809,992

(22) Filed: Jun. 4, 2007

(65) Prior Publication Data
US 2007/0278901 A1    Dec. 6, 2007

(30) Foreign Application Priority Data
Jun. 3, 2006    (JP)    ............................. 2006-155483

(51) Int. Cl.
*H01L 41/047* (2006.01)
*B41J 2/045* (2006.01)

(52) U.S. Cl. ........................................ 310/366; 347/71

(58) Field of Classification Search ................. 310/366; 347/68, 71, 72
See application file for complete search history.

(56) References Cited

U.S. PATENT DOCUMENTS

| 6,595,628 | B2 | 7/2003 | Takagi et al. |
| 7,073,894 | B2 | 7/2006 | Isono et al. |
| 2001/0020968 | A1* | 9/2001 | Isono et al. .................. 347/71 |
| 2005/0162484 | A1 | 7/2005 | Isono |
| 2005/0248628 | A1 | 11/2005 | Isono |
| 2005/0253488 | A1* | 11/2005 | Ito ............................ 310/366 |
| 2006/0103698 | A1* | 5/2006 | Takahashi .................... 347/71 |

FOREIGN PATENT DOCUMENTS

| JP | 2002-254634 | 9/2002 |
| JP | 2004-243648 | 9/2004 |
| JP | 2006-15539 | 1/2006 |

* cited by examiner

*Primary Examiner*—Thomas M Dougherty
(74) *Attorney, Agent, or Firm*—Reed Smith LLP

(57) ABSTRACT

A piezoelectric actuator includes a first ceramic sheet having an individual electrode formed thereon, a second ceramic sheet having a common electrode formed thereon, a top ceramic sheet having a surface electrode for the individual electrode and a surface electrode for the common electrode formed thereon, wherein the surface electrode for the common electrode is divided by a plurality of slits into a plurality of electrode-portions each having a area of not more than a predetermined area. Accordingly, when these ceramic sheets are calcinated to be integrated together, this construction makes it possible to lower the affect due to difference in the amount of thermal shrinkage between the surface electrode for the common electrode and the top ceramic sheet, thereby suppressing the arching deformation of the top ceramic sheet.

13 Claims, 13 Drawing Sheets

Fig. 5
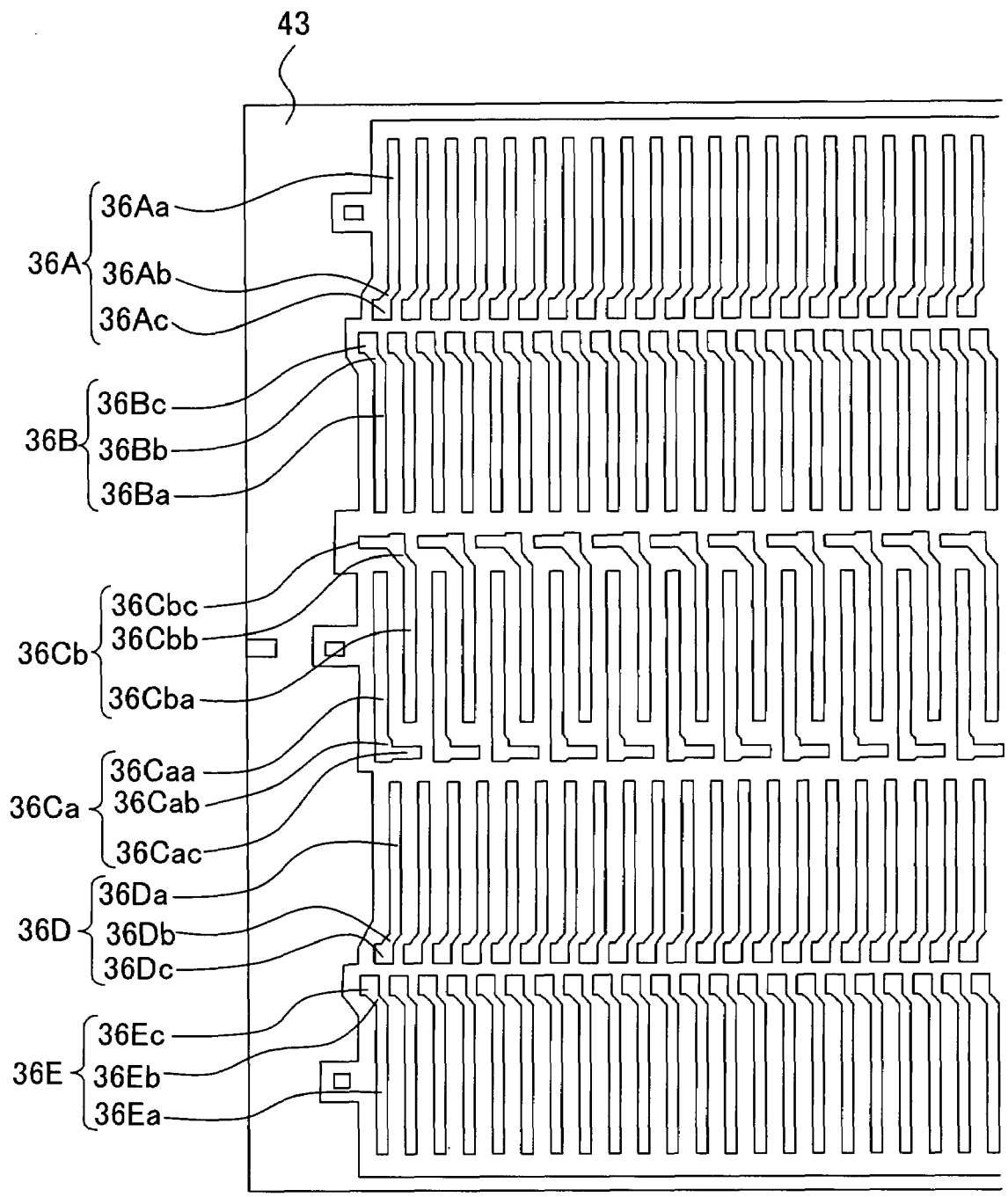
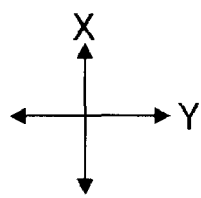

PIEZOELECTRIC ACTUATOR AND METHOD FOR PRODUCING THE SAME

CROSS REFERENCE TO RELATED APPLICATION

The present application claims priority from Japanese Patent Application No. 2006-155483 filed on Jun. 3, 2006, the disclosure of which is incorporated herein by reference in its entirety.

BACKGROUND OF THE INVENTION

1. Field of the Invention

The present invention relates to a piezoelectric actuator and a method for producing the piezoelectric actuator.

2. Description of the Related Art

As a conventional ink-jet head, there is known an ink-jet head having a cavity unit which is constructed by stacking a plurality of sheets and which has a plurality of pressure chambers formed and aligned in rows therein, and a piezoelectric actuator which has active portions (energy-generating mechanism) corresponding to the pressure chambers respectively and which is joined to the cavity unit. For example, as shown in FIG. 4 of U.S. Patent Application Publication No. US2005/162484A1 and FIG. 4 of U.S. Patent Application Publication No. US2005/248628 (corresponding to FIG. 4 of Japanese Patent Application Laid-open No. 2006-15539), there is known a piezoelectric actuator including a stack-portion in which ceramic sheets each having a pattern of individual electrodes is formed on a surface thereof and ceramic sheets each having a pattern of a common electrode formed on a surface thereof are stacked alternately, and a top ceramic sheet which is arranged above the stack-portion and which has surface electrodes for the individual electrodes (individual-surface electrodes) and surface electrodes for the common electrode (common-surface electrodes) formed on a surface thereof; wherein these ceramic sheets are calcinated to be integrated, and the surface electrodes for the common electrode are formed to be elongated on the surface of the top ceramic sheet.

In such a piezoelectric actuator, the surface electrodes for the common electrode are formed on the surface of the top ceramic sheet at both end portions in a row direction of the surface electrodes for the individual electrodes, and the surface electrodes for the common electrode are formed in a direction orthogonal to the row direction.

In the recent years, there is a tendency that the number of the nozzles is increased for increasing the recording speed and for realizing higher resolution. As the number of nozzles is increased, the number of surface electrodes for the individual electrodes is increased as well. With this, the electric current passing in the surface electrodes for the common electrode are increased, which in turn makes it necessary to secure a larger area for the surface electrodes for the common electrode. As a result, the surface electrodes for the common electrode are formed to be elongated on the surface of the top ceramic sheet.

A material forming the surface electrodes for the common electrode has a thermal shrinkage greater than that of a material for forming the top ceramic sheet. Therefore, when the surface electrodes for the common electrode are formed to be elongated on the top ceramic sheet, and when the top ceramic sheet is subjected to the calcination as described above to be integrated to form the piezoelectric actuator, there is a fear that the piezoelectric actuator is damaged or broken due to the difference in the amount of thermal shrinkage between the top ceramic sheet and the surface electrodes for the common electrode. Namely, the piezoelectric actuator is arched or warped with a side of the surface electrodes for the common electrode being the valley of the arch or warpage, and there is a fear that the piezoelectric actuator is cut in some cases. For example, in a case that a flexible flat cable is used for inputting a driving signal, it is difficult to connect connection terminals of signal lines of the flexible flat cable to the surface electrodes of an arched piezoelectric actuator, respectively. Further, upon joining the arched piezoelectric actuator to the cavity unit of the ink-jet head, it is difficult to make the piezoelectric actuator to be attached tightly with respect to the pressure chambers in a uniform manner, which results in causing ink leakage, thereby making the jetting force and/or the like to be non-uniform.

An object of the present invention is to provide a piezoelectric actuator and a method for producing the piezoelectric actuator capable of lowering the influence of the difference in the amount of thermal shrinkage between the top ceramic sheet and a surface electrode for the common electrode when the piezoelectric actuator is subjected to the calcination, thereby suppressing the arching deformation of the piezoelectric actuator to secure a predetermined flatness thereof.

SUMMARY OF THE INVENTION

According to a first aspect of the present invention, there is provided a piezoelectric actuator in which a plurality of stacked ceramic sheets are calcinated to be integrated, including: a first ceramic sheet on which a first electrode is formed; a second ceramic sheet which is stacked on the first ceramic sheet and on which a second electrode is formed; and a top ceramic sheet which is rectangular elongated in a predetermined direction and stacked above the first and second ceramic sheets and on which a first surface electrode corresponding to the first electrode and a second surface electrode corresponding to the second electrode are formed, the second surface electrode extending, at an end portion in the predetermined direction of the top ceramic sheet, in a direction orthogonal to the predetermined direction; wherein a plurality of slits are formed in the second surface electrode to divide the second surface electrode into a plurality of electrode portions.

According to the first aspect of the present invention, since the second surface electrode (surface electrode for the common electrode; common-surface electrode) is divided into a plurality of electrode portions, the difference in the amount of thermal shrinkage generated during the calcination is lowered between the top ceramic sheet and the second surface electrode in the extending (elongating) direction of the second surface electrode. Further, since the plurality of slits is formed in the second surface electrode, the difference in the amount of thermal shrinkage generated between the second surface electrode and the top ceramic sheet is absorbed. Accordingly, the arching deformation with a portion provided with the second surface electrode being the valley of the arch is suppressed, securing a predetermined flatness. Thus, it is advantageous for joining the piezoelectric actuator to the cavity unit and connecting the piezoelectric actuator to the flexible flat cable.

In the piezoelectric actuator of the present invention, an upper surface of the top ceramic sheet may be exposed at portions, of the second surface electrode, at which the slits are formed. In this case, since the upper surface of the top ceramic sheet is exposed by the slits formed in the second surface electrode, it is possible to absorb the difference in the amount of thermal shrinkage generated between the second surface electrode and the top ceramic sheet in an assured manner.

The piezoelectric actuator of the present invention may be joined to a cavity unit including a plurality of nozzle rows each of which has a plurality of nozzles for jetting liquid-droplets of a liquid and a plurality of pressure-chamber rows each of which has a plurality of pressure chambers corresponding to the nozzles respectively; and the first electrode may have a plurality of individual electrodes arranged to correspond to the pressure chambers respectively, and the second electrode may have a common electrode arranged commonly for the pressure chambers.

In this case, the difference in the amount of thermal shrinkage generated between the second surface electrode and the top ceramic sheet is absorbed to thereby suppress the arching deformation of the piezoelectric actuator. Accordingly, when the piezoelectric actuator of the present invention is joined to the cavity unit having a plurality of rows of pressure chambers corresponding to a plurality of rows of nozzles jetting the liquid droplets respectively, it is possible to join the piezoelectric actuator to the cavity unit highly precisely.

In the piezoelectric actuator of the present invention, a plurality of through holes may be formed in the first, second and top ceramic sheets, respectively, the through holes penetrating through the first, second and top ceramic sheets respectively in a stacking direction thereof; an electrically conductive paste may be filled in the through holes to electrically connect the second electrode and the second surface electrode in the stacking direction; and portions, of the second surface electrode, at which the slits are formed respectively may not overlap with a through hole, among the through holes, which is formed in the top ceramic sheet.

In this case, the slits formed in the second surface electrode are arranged at positions at which the slits do not overlap with any of the through holes for electric conduction (electric connection). Accordingly, the electric conduction by the through holes is not adversely affected.

In the piezoelectric actuator of the present invention, the first electrode may have a plurality of individual electrodes arranged in a plurality of rows; the second electrode may face the individual electrodes in a stacking direction of the first, second and top ceramic sheets and may extend in a row direction of the rows of the individual-electrodes; the first surface electrode may have a plurality of first surface electrodes arranged in a plurality of rows corresponding to the individual electrodes, respectively; and the second surface electrode may be formed on the top ceramic sheet at an edge portion in a row-extending direction in which the rows of the first surface electrodes extend, the second surface electrode extending in a row-arrangement direction in which the rows of the first surface electrodes are arranged.

In this case, the second surface electrode is formed on the surface of the top ceramic sheet to extend (to be elongated) at the edge portion in the row-arrangement direction of the rows of the first surface electrodes, and the slits are formed in the second surface electrode. Accordingly, it is possible to absorb the difference in the amount of thermal shrinkage between the second surface electrode and the top ceramic sheet generated during the calcination in the extending (elongating) direction of the second surface electrode.

In the piezoelectric actuator of the present invention, the slits may extend in a crossing direction crossing an extending direction of the second surface electrode. Here, the term "crossing direction" includes not only a direction orthogonal to the extending direction of the second surface electrode but also a direction inclined with respect to the extending direction of the second surface electrode.

In this case, the slits are constructed (formed) to extend in the direction crossing the extending direction of the second surface electrode. Although this is a simple construction, it is capable of suppressing the arching deformation of the piezoelectric actuator during the calcination.

In the piezoelectric actuator of the present invention, the first, second and top ceramic sheets may be formed of lead zirconate titanate; and the first and second electrodes and the first and second surface electrodes conducted to the first and second electrodes respectively may be formed by performing screen printing with an electrically conductive paste containing a silver-palladium based metallic material.

In this case, the difference in thermal shrinkage is great between lead zirconate titanate which is the material for forming the first, second and top ceramic sheets and the electrically conductive paste containing the silver-palladium based metallic material for forming the first and second electrodes and the first and second surface electrodes conducted to the first and second electrodes respectively. However, the arching deformation, with the side of the second surface electrode being the valley of the arch, is suppressed.

According to a second aspect of the present invention, there is provided a piezoelectric actuator in which a plurality of stacked ceramic sheets are calcinated to be integrated, the actuator including: a first ceramic sheet on which a first electrode is formed; a second ceramic sheet which is stacked on the first ceramic sheet and on which a second electrode is formed; and a top ceramic sheet which is rectangular and stacked above the first and second ceramic sheets and on which a first surface electrode corresponding to the first electrode and a second surface electrode corresponding to the second electrode are formed, the second surface electrode extending, at an end portion in a longitudinal direction of the top ceramic sheet, in a direction orthogonal to the predetermined direction; wherein a plurality of through holes are formed in the second surface electrode.

According to the second aspect of the present invention, since a plurality of through holes is formed in the second surface electrode, it is possible to absorb the difference in the amount of thermal shrinkage generated in the second surface electrode and the top ceramic sheet, and to suppress the arching deformation of the piezoelectric actuator. Note that all the through holes formed in the second surface electrodes need not to have a same size; and that it is allowable, for example, the second surface electrode is formed in a net-shape in a plan view.

According to a third aspect of the present invention, there is provided a method for producing a piezoelectric actuator, the method including: preparing a first green sheet on which an individual electrode is formed, and a second green sheet on which a common electrode is formed; preparing a third green-sheet which is substantially rectangular; forming a first surface electrode for the individual electrode and a second surface electrode for the common electrode on the third green sheet, the second surface electrode extending in a short side of the third green sheet at an end portion in a longitudinal direction of the third green sheet; forming a plurality of slits in the second surface electrode to divide the second surface electrode into a plurality of electrode portions so that a surface of the third green sheet is exposed in the slits; and stacking and calcinating the first, second and third green-sheets.

According to the third aspect of the present invention, the slits at each of which the upper surface of the top green sheet is exposed are formed and then the calcination is performed. Accordingly, owing to the slits, the difference in the amount of thermal shrinkage between the second surface electrode and the third green sheet in the extending (elongating) direction of the second surface electrode is lowered, thereby absorbing the difference in the amount of thermal shrinkage generated between the second surface electrode and the third green sheet. Therefore, the arching deformation, with the side of a portion at which the second surface electrode is arranged being the valley of the arch, is suppressed, and thus a predetermined flatness is secured.

The method for producing the piezoelectric actuator of the present invention may further include: forming through holes in the first, second and third green sheets respectively, the through holes penetrating through the first, second and third ceramic sheets respectively in a thickness direction thereof; filling an electrically conductive paste in the through holes; forming the slits so as not to overlap with a portion, of the third green sheet, at which a through hole among the through holes is formed; and stacking the first, second and third green sheets to electrically connect the common electrode and the second surface electrode and to electrically connect the individual electrode and the first surface electrode in a stacking direction of the first, second and third green sheets by the electrically conductive paste filled in the through holes.

In this case, since the slits are formed on the third green sheet so as not to overlap with the portion at which one through hole among the through holes for electrical conduction (electrical connection) is formed, the conduction by the through holes is not hindered or adversely affected.

The method for producing the piezoelectric actuator of the present invention may further include: forming the individual electrode as a plurality of individual electrodes arranged in a plurality of rows on a surface of the first green sheet; forming the common electrode on a surface of the second green sheet to face the individual electrodes in the stacking direction of the first, second and third green sheets and to extend in an row-extending direction in which the rows of the individual electrodes extend; forming the first surface electrode on the surface of the third green sheet as a plurality of first surface electrodes arranged in a plurality of rows corresponding to the individual electrodes; and forming the second surface electrode, on the third green sheet, at an end portion in a row direction of the rows of the first surface electrodes to extend in a row-arrangement direction in which the rows of the first surface electrodes are arranged.

In this case, the second surface electrode is formed on the surface of the third green sheet at the end portion in the row direction of the rows of the first individual electrodes to be elongated in the row-arrangement direction in which the rows of the first surface electrodes are arranged. However, since the slits are formed, it is possible to thereby absorb the difference in the amount of thermal shrinkage generated during the calcination between the second surface electrode and the third ceramic sheet in the elongating direction of the second surface electrode.

BRIEF DESCRIPTION OF THE DRAWINGS

FIG. 5 is a plan view of a first ceramic sheet in which a part of the first ceramic sheet is omitted;

DESCRIPTION OF THE PREFERRED EMBODIMENTS

Figure 1:
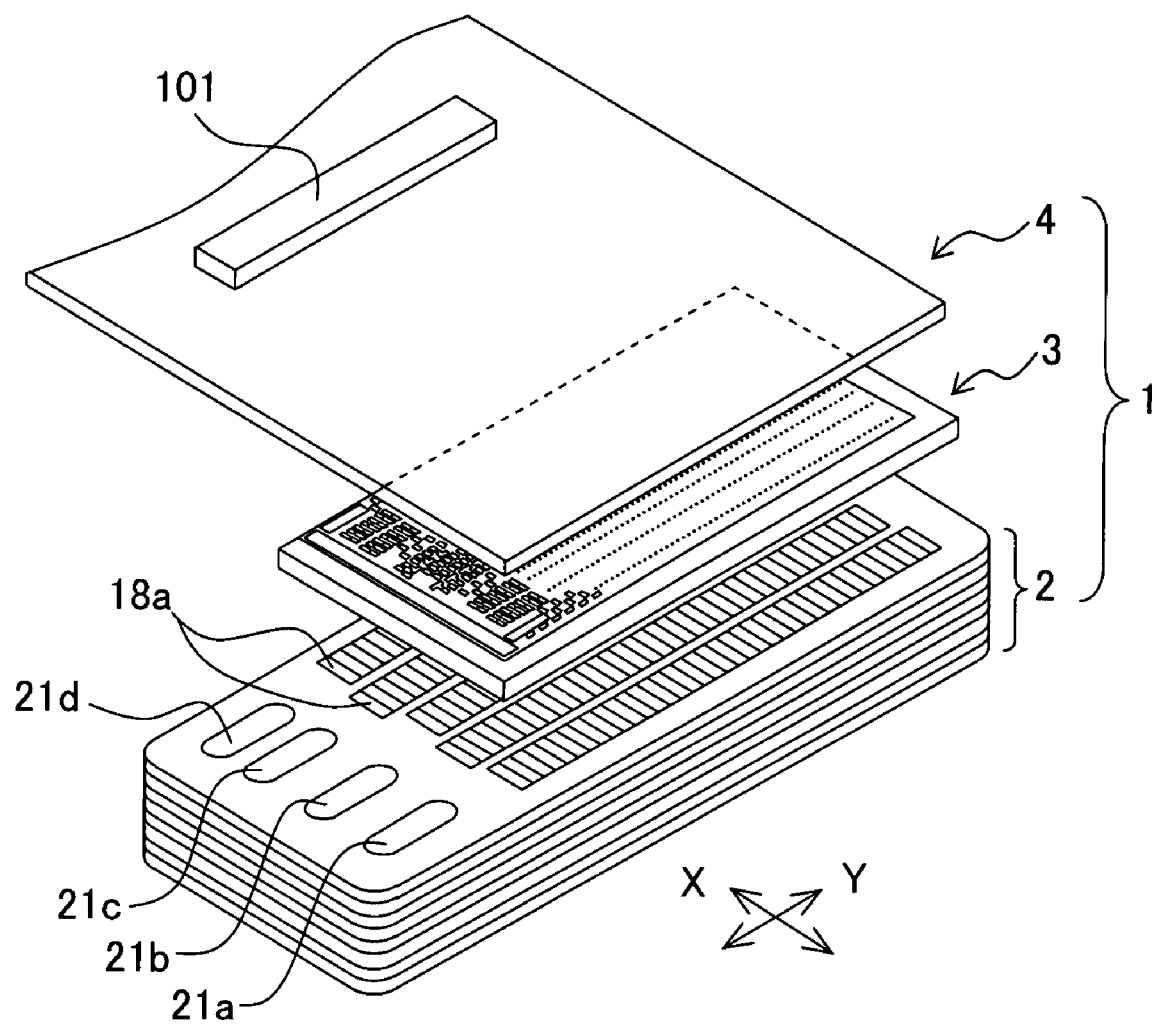
FIG. 1 is a perspective view showing a cavity unit, a piezoelectric actuator and a flat cable of a piezoelectric ink-jet head of the present invention in a state that the cavity unit, the actuator and the flat cable are separated from one another.

In the following, an embodiment of the present invention will be explained with reference to the drawings. Note that an ink-jet head including the piezoelectric actuator according to the embodiment is an ink-jet head for color recording. Although not specifically shown in the drawings, the ink-jet head is provided on a carriage which reciprocates in an X-direction (main scanning direction) which is orthogonal to a Y-direction (sub-scanning direction) as a transport direction of a recording paper. For example, four color inks (cyan, magenta, yellow and black inks) are supplied to the ink-jet head from ink cartridges provided on the carriage or from ink tanks arranged in the body of the printer, via ink supply pipes and damper tanks provided on the carriage.

Figure 2:
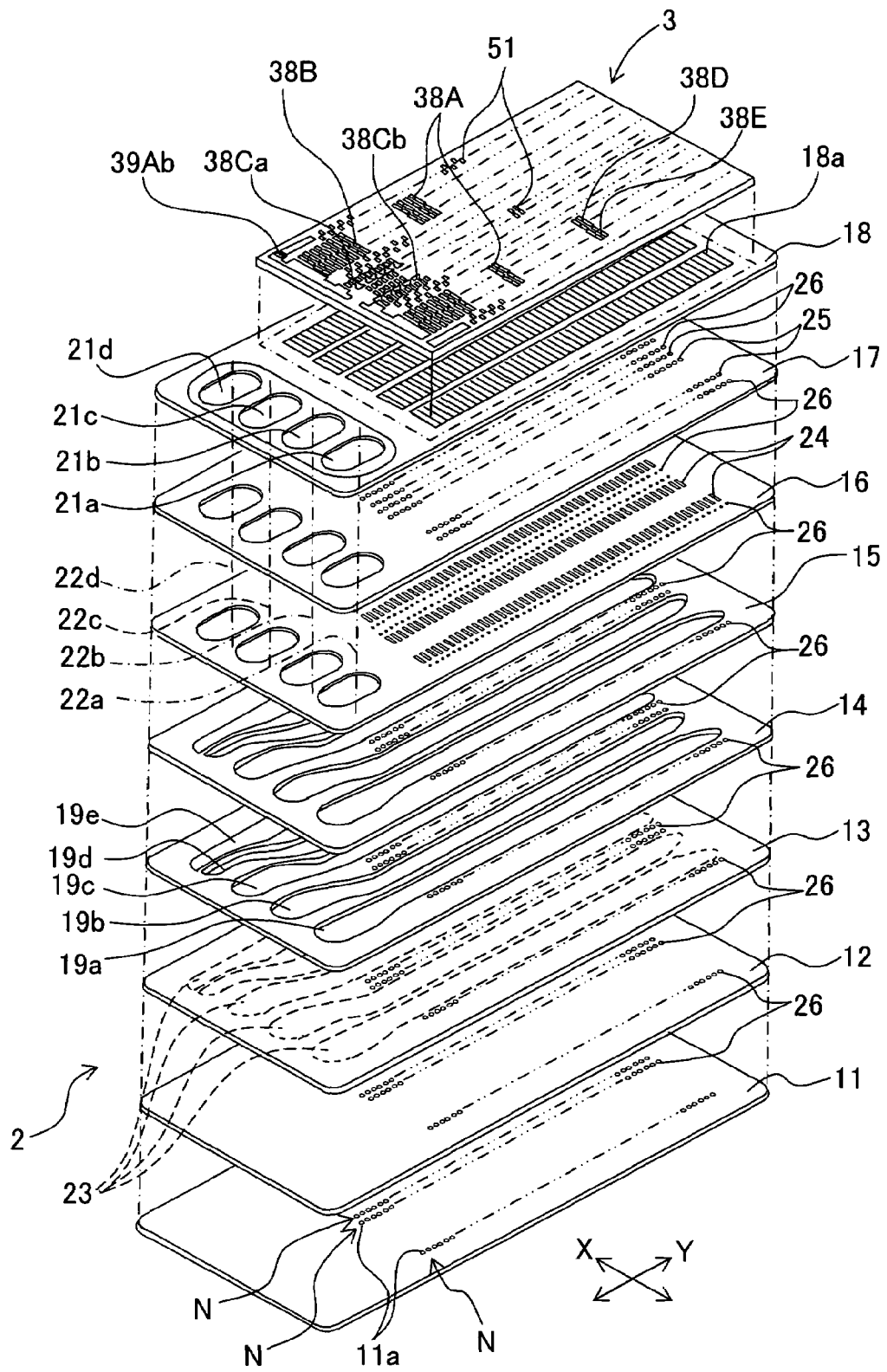
FIG. 2 is an exploded perspective view of the cavity unit.
Figure 3:
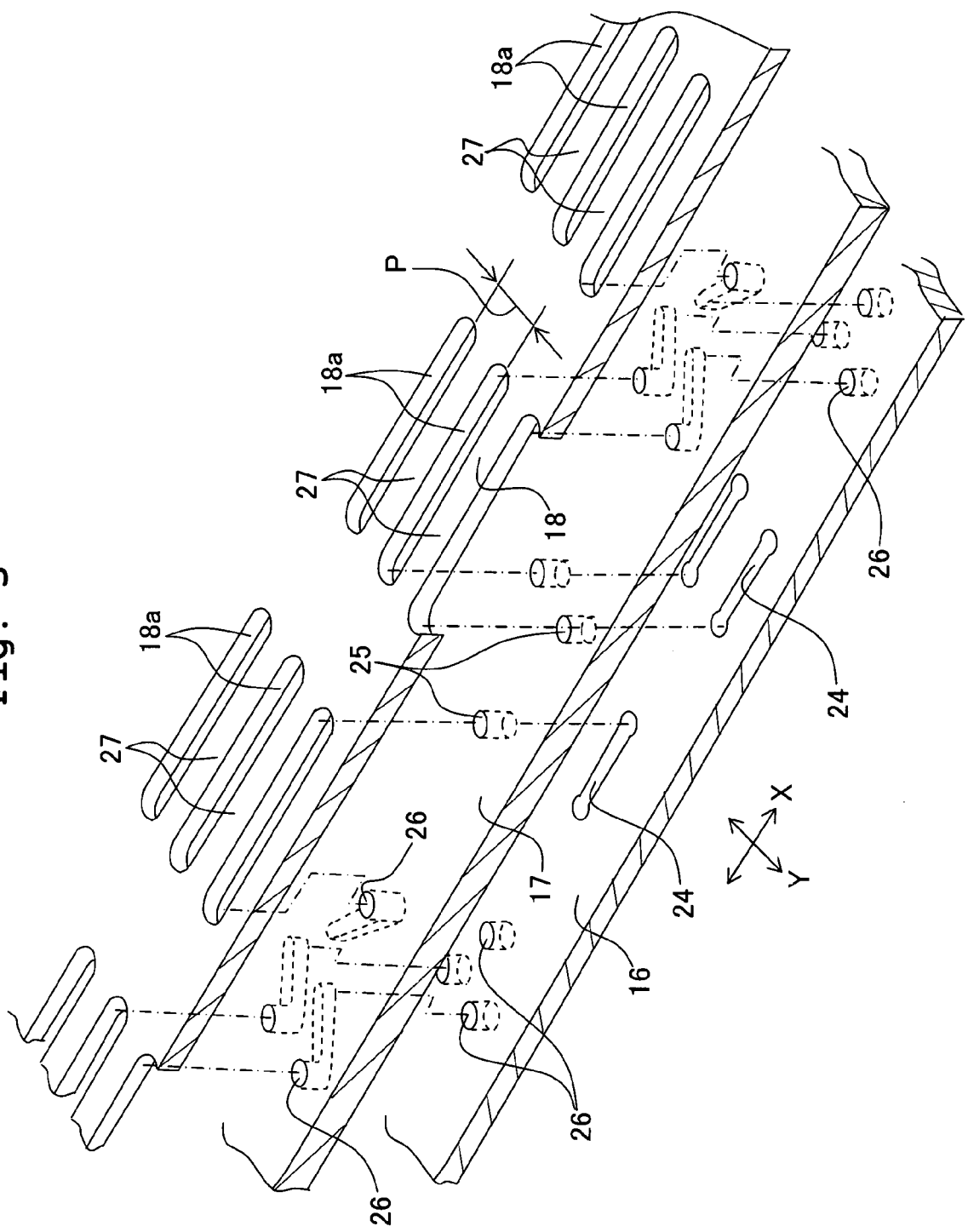
FIG. 3 is an exploded perspective view of a part of the cavity unit.

FIG. 1 is a perspective view showing a state that a flexible flat cable is joined to the upper surface of an ink-jet head to which the present invention is applied; FIG. 2 is a perspective view showing the cavity unit and the like; and FIG. 3 is a partial perspective view showing main components of the cavity unit in an enlarged manner.

As shown in FIG. 1, an ink-jet head 1 is provided with a cavity unit 2 having a plurality of pressure chambers formed and arranged in a plurality of rows in the cavity unit 2, and a plate-type piezoelectric actuator 3 which is adhered onto the cavity unit 2. A flexible flat cable 4 via which a driving signal is inputted is joined to the upper surface of the piezoelectric actuator 3. The pressure chambers correspond to a plurality of nozzles which jet liquid droplets, respectively.

The cavity unit 2 is a stacked body (laminated body) in which eight pieces of plates are stacked and adhered onto one another. As shown in FIG. 2, the cavity unit 2 includes, in a order from bottom up, a nozzle plate 11, a cover plate 12, a damper plate 13, a lower manifold plate 14, an upper manifold plate 15, a lower spacer plate 16, an upper spacer plate 17, and a base plate 18 in which pressure chambers 18a are formed. The nozzle plate 11 is made of a synthetic resin material, and the remaining plates 12 to 18 are each made of 42% nickel alloy steel plate. Each of the plates 11 to 18 has a thickness of about 50 μm to 150 μm.

In the nozzle plate 11 forming the lower surface of the cavity unit 2, five nozzle rows N (FIG. 2 shows only three of the nozzle rows N). Each of the nozzle rows N includes a large number of nozzles 11a which are arranged in the Y-direction and which jet the ink. Each of the nozzles 11a has a hole diameter of about 25 μm.

In each of the lower and upper manifold plates 14 and 15, five through holes elongated in the Y-direction are formed to penetrate the plate in the thickness direction thereof, corresponding to the nozzle rows N respectively. The manifold plates 14 and 15 are sandwiched by the lower space plate 16 and the damper plate 13, so that the five through holes form five manifold chambers 19a, 19b, 19c, 19d and 19e (common ink chambers). Note that the manifold chambers 19a, 19b and 19c are for the cyan ink (C), yellow ink (Y) and magenta ink (M) respectively, and the manifold chambers 19d and 19e are for the black ink (BK).

In FIG. 2, four ink supply holes 21a, 21b, 21c and 21d are aligned in a row in the base plate 18 at one end portion in the Y-direction of the base plate 18. The ink supply holes 21a, 21b and 21c supply the inks to the manifold chambers 19a, 19b and 19c respectively; and the ink supply hole 21d supplies the ink to the two manifold chambers 19e and 19d. As shown in FIG. 2, ink supply channel 22a, 22b, 22c and 22d are formed in each of the upper and lower spacer plates 17 and 16 at an end portion thereof. Upstream-side ends of the ink supply channel 22a to 22d are communicated with the ink supply holes 21a to 21d respectively. A downstream-side end of each of the ink supply channel 22a, 22b and 22c is communicated with one end of one of the manifold chambers 19a, 19b and 19c to which the ink supply channel corresponds; and a downstream-side end of the ink supply channel 22d is communicated with one ends of the manifold chambers 19d and 19e.

Further, five recesses are formed in the lower surface of the damper plate 13. The recesses are open downwardly and have shapes corresponding in a plan view to the manifold chambers 19a to 19e, respectively. The openings of the recesses are closed by the cover plate 12 to define damper chambers 23 in a closed state. When the piezoelectric actuator 3 is driven, although pressure wave is propagated to the pressure chambers 18a, a component (backward-moving component) of the pressure wave toward the manifold chambers 19a to 19e is absorbed by the vibration of thin-walled portions of the walls of the damper chambers 23, thereby making it possible to prevent the occurrence of so-called crosstalk.

As shown in FIG. 3, throttles 24 are formed in the lower spacer plate 16 corresponding to the nozzles 11a in each of the nozzle rows N respectively. Each of the throttles 24 is a slim recess extending in the X-direction. An end of each of the throttles 24 is communicated with one of the manifold chambers 19a to 19e in the upper manifold plate 15 to which the throttle 24 correspond, and the other end of each of the throttles 24 is communicated, in the upper spacer plate 17, with one of communication holes 25 penetrating through the upper spacer plate 17 in the up and down direction.

Communication channels 26, which are communicated with the nozzles 11a in each of the nozzle rows N, are formed in each of the cover plate 12, damper plate 13, upper and lower manifold plates 14, 15, and lower and upper spacer plates 16, 17 to penetrate through the plate in up and down direction, at positions at which the communication channels 26 do not overlap with any of the manifold chambers 19a to 19e or any of the manifold chambers 23 in the up and down direction.

Furthermore, the pressure chambers 18a are formed in the base plate 18 to be elongated in the X-direction and to penetrate through the base plate 18 in the thickness direction thereof. The pressure chambers 18a correspond to the nozzles 11a respectively, and the pressure chambers 18a are arranged to form rows (pressure-chamber rows) corresponding to the nozzle rows N. One ends in the longitudinal direction of the pressure chambers 18a are communicated with the communication holes 25 in the upper spacer plate 17 respectively; and the other ends in the longitudinal direction of the pressure chambers 18a are communicated with the communication channels 26 which are formed in each of the plates 12 to 17 to penetrate therethrough. As shown in FIG. 3, the pressure chambers 18a in each of the pressure-chamber rows are arranged in the Y-direction at a predetermined pitch P with partition walls 27 being intervened therebetween. A pressure chamber 18 in a certain pressure-chamber row among the pressure-chamber rows is arranged to be shifted by a half the pitch P (P/2) with respect to another pressure chamber 18a belonging to another pressure-chamber row adjacent to the certain pressure-chamber row. Namely, the pressure-chamber rows are arranged in a staggered manner from one another.

Accordingly, the inks, supplied from the ink supply holes 21a to 21d inflow to the manifold chambers 19a to 19e respectively, and then flow through the throttles 24 and the communication holes 25 to be distributed to the pressure chambers 18a. Then, the inks flow through the pressure chambers 18a to the communication channels 26a respectively, then reach to the nozzles 11a corresponding to the pressure chambers 18a respectively, and the inks are jetted as liquid droplets (ink droplets) from the nozzles 11a.

Figure 4:
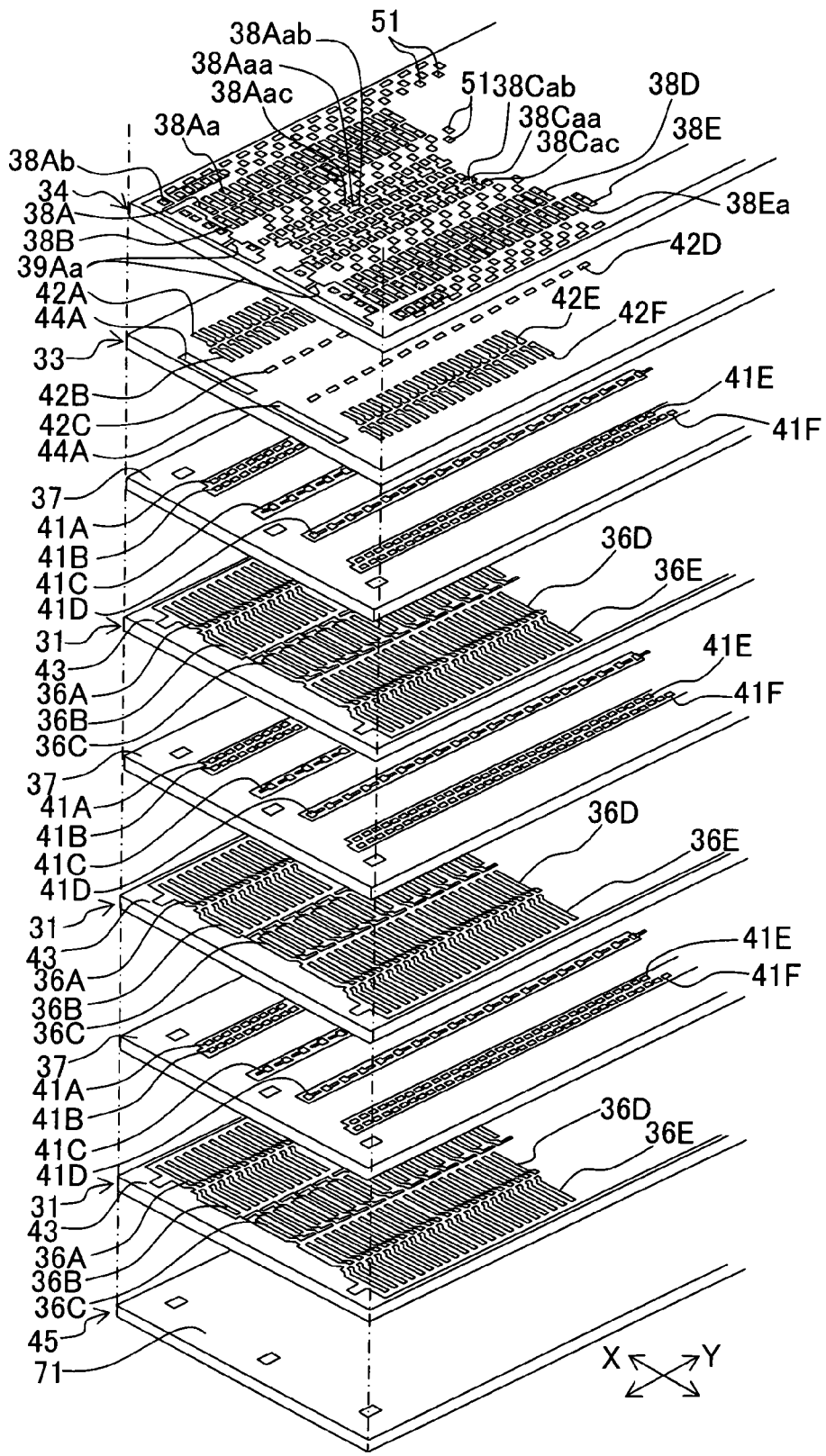
FIG. 4 is an exploded perspective view of the piezoelectric actuator in which a part of the piezoelectric actuator is omitted.

As shown in FIG. 4, the piezoelectric actuator 3 includes three pieces of first ceramic sheets 31 each of which has a pattern of individual electrodes 36A, 36B, 36C, 36D and 36E formed on a surface thereof; three pieces of second ceramic sheets 32 each of which has a pattern of a common electrode 37 formed on a surface thereof; a dummy ceramic sheet 33 for the electric conduction (conduction-dummy ceramic sheet 33); a top ceramic sheet 34 which has surface electrodes 38A, 38B, 38C, 38D and 38E for the individual electrodes (individual-surface electrodes 38A to 38E) formed on a surface thereof and surface electrodes 39A, 39B for the common electrode (common-surface electrodes 39A, 39B) formed on the surface thereof; and a third ceramic sheet 35 having a common electrode 37B formed entirely on a surface thereof. Three pieces of the first ceramic sheets 31 and three pieces of the second ceramic sheets 32 are alternately stacked onto one another; the conduction-dummy ceramic sheet 33 is stacked on the alternately stacked first and second ceramic sheets 31, 32; and the top ceramic sheet 34 is further stacked on the conduction-dummy ceramic sheet 33. Furthermore, the third ceramic sheet 35 is stacked, as the lowermost layer, below the stacked portion in which the first and second ceramic sheets 31, 32 are stacked. Here, the conduction-dummy ceramic sheet 33 and the top ceramic sheet 34 function as restricting layers (regulating layers). Namely, when active portions of the first and second ceramic sheets 31 and 32 are displaced as will be described later on, the conduction-dummy ceramic sheet 33 and the top ceramic sheet 34 function to suppress the displacement of the active portions in a direction opposite to the pressure chambers 18a and to direct the displacement of the active portions more to a direction toward the pressure chambers 18a.

These ceramic sheets 31 to 35 are formed as follows. First, green sheets are formed by preparing a mixture liquid of lead zirconate titanate (PZT ($PbTiO_3$—$PbZrO_3$))-based ceramic powder which is ferroelectric, a binder and a solvent, and spreading the mixture liquid to a sheet-like shape, and by performing drying therefor. An electrically conductive material (Ag—Pd based conductive paste) is coated on the green sheets by the screen printing or the like to thereby form the respective electrodes as described above. Then, these green sheets are stacked together and calcinated to be integrated. Afterwards, a high voltage is applied between the individual and common electrodes to polarize the ceramic sheets at portions thereof sandwiched between the individual and common electrodes. With this, so-called piezoelectric characteristic (property to be displaced by the application of drive voltage) is imparted to the polarized portions of the ceramic sheets. Note that each of the ceramic sheets 31 to 35 has a thickness of about 30 μm. Further, it is enough that conduction-dummy ceramic sheet 33, the top ceramic sheet 34 and the third ceramic sheet 35 have the insulating property. Accordingly, these sheets 33 to 35 may be formed of a material exhibiting no piezoelectric characteristic.

As shown in FIG. 5, on a surface of each of the first ceramic sheets 31, the individual electrodes (first electrodes) 36A to 36E are formed and arranged in five rows corresponding to the pressure chambers 18a arranged in five rows, respectively. The individual electrodes 36A to 36E have linear portions 36Aa to 36Ea, bent portions 36Ab to 36Eb extending from one ends of the linear portions 36Aa to 36Ea respectively, and conduction portions 36Ac to 36Ec having a rectangular shape and connected to the bent portions 36Ab and 36Eb, respectively. Each of the linear portions 36Aa to 36Ea has an approximately same length as that of one of the pressure chambers 18a and overlaps with one of the pressure chambers 18a in a plan view. Further, each of the linear portions 36Aa to 36Ea has a width slightly narrower that that of one of the pressure chambers 18a.

The individual electrodes 36C arranged in the center in the first ceramic sheet 31 include two kinds of individual electrodes, namely individual electrodes 36Ca and 36Cb. The individual electrodes 36Ca and 36Cb are formed such that the conduction portions 36Cac and 36Cbc extend alternately in mutually opposite directions from one ends of the linear portions 36Caa and 36Cba respectively, the one ends corresponding to outer end portions of the pressure chambers 18a respectively, via the bent portions 36Cab and 36Cbb extending outwardly from the linear portions 36Caa and 36Cba, respectively.

The individual electrodes 36B, 36D arranged in rows outside the individual electrodes 36Ca and 36Cb respectively are formed such that the conduction portions 36Bc, 36Dc are connected to one ends of the linear portions 36Ba, 36Da respectively, the one ends corresponding to outer end portions of the pressure chambers 18a, via the bent portions 36Bb, 36Db extending outwardly from the linear portions 36Ba, 36Da, respectively. The individual electrodes 36A, 36E arranged in rows outside the individual electrodes 36B and 36D respectively are formed such that the conduction portions 36Ac, 36Ec are connected to one ends of the linear portions 36Aa, 36Ea respectively, the one ends corresponding to inner end portions of the pressure chambers 18a, via the bent portions 36Ab, 36Eb extending outwardly from the linear portions 36Aa, 36Ea, respectively. As shown in FIG. 5, the conduction portions 36Ac and 36Bc are shifted from each other, in a row direction of the individual electrodes, by half the alignment pitch P (by P/2) for the rows of the pressure chambers 18a. Similarly, the conduction portions 36Dc and 36Ec are shifted from each other in the row direction of the individual electrodes by P/2. The conduction portions 36Ac to 36Ec are arranged to correspond to the partition walls 27 between the pressure chambers 18a respectively.

Further, the conduction portions 36Ac to 36Ec of the individual electrodes 36A to 36E in each of the first ceramic sheets 31 are arranged so that at least a part of each of the conduction portions 36Ac to 36Ec overlap in a plan view with one of conduction electrodes 41A, 41B, 41C, 41D, 41E and 41F arranged in rows in the second ceramic sheets 32 adjacent to the first ceramic sheet 31 in the up and down directions respectively, or with one of conduction electrodes 42A, 42B, 42C, 42D, 42E and 42F arranged in rows in the conduction-dummy ceramic sheet 33.

Furthermore, on each of the first ceramic sheets 31, a dummy common electrode 43 is formed at a portion at which a part of the dummy common electrode 43 overlaps in a plan view with the common electrode 37 (first belt-like portions 37A to 37G) in each of the second ceramic sheets 32, the portion being an outer periphery portion located on a surface of the first ceramic sheet 31 along the short and long sides thereof.

Figure 6:
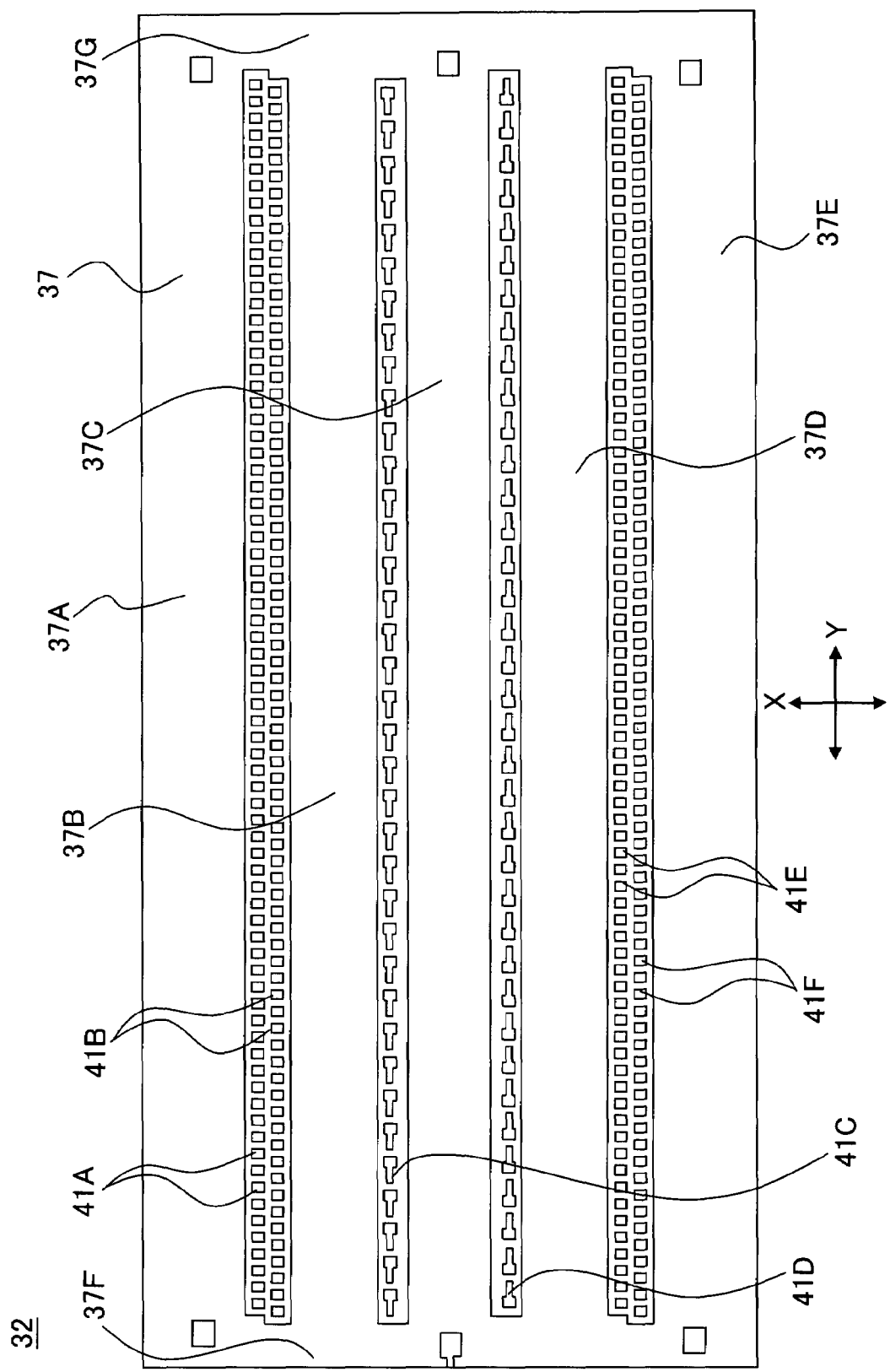
FIG. 6 is a plan view of a second ceramic sheet.

As shown in FIG. 6, the common electrode 37 (second electrode) which is common to the pressure chambers 18a is arranged on a surface of each of the second ceramic sheets 32. The common electrode 37 has five first belt-like portions 37A, 37B, 37C, 37D and 37E which face the individual electrodes 36A, 36B and 36C, arranged in rows in the first ceramic sheet 31, in the stacking direction, and which extend in the row direction of the individual electrodes; and the common electrode 37 has second belt-like portions 37F and 37G which connect the first belt-like portions 37A to 37E at end portions in the longitudinal direction of the second ceramic sheet 32.

Between the first belt-like portions 37A to 37E, the conduction electrodes 41A to 41F are arranged in rows respectively. The conduction electrodes 41A to 41F correspond to the conduction portions 36Ac to 36Fc of the individual electrodes 36A to 36F respectively. Namely, the common electrode 37 surrounds the conduction electrodes 41A to 41F arranged in rows.

Note that the conduction electrodes 41C and 41D located at the central portion on the second ceramic sheet 32 are arranged in rows at a pitch in the row direction twice a pitch at which conduction electrodes 41A, 41B, 41E and 41F are arranged in rows at both sides of the rows of the conduction electrodes 41C and 41D, respectively. The conduction electrodes 41C and 41D correspond to the individual electrodes 36Ca and 36Cb arranged in rows at the center of the first ceramic sheet 31, respectively.

Figure 7:
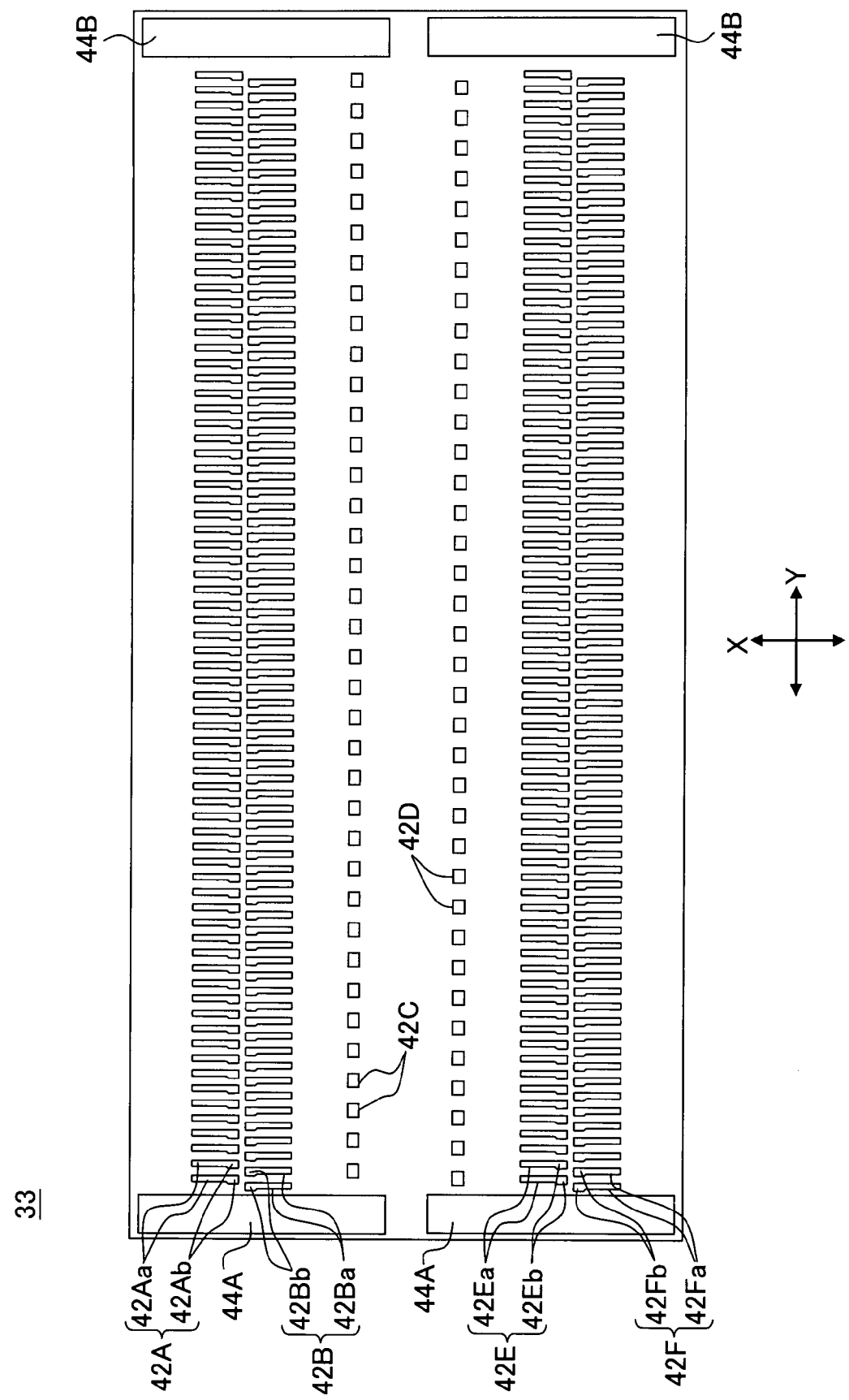
FIG. 7 is a plan view of a dummy ceramic sheet used for electrical conduction (dummy ceramic sheet for adjustment)

As shown in FIG. 7, on a surface of the conduction-dummy ceramic sheet 33, conduction electrodes 42A to 42F are arranged in rows at positions corresponding to positions on extension lines from the partition walls 27 each between adjacent two pressure chambers 18a, similarly in the second ceramic sheet 32.

The conduction electrodes 42C, 42D located at the center on the conduction-dummy ceramic sheet 33 are arranged in rows at a pitch twice a pitch at which the conduction electrodes 42A, 42B, 42E and 42F are arranged in rows at both sides of the rows of the conduction electrodes 42C and 42D. The conduction electrodes 42C and 42D correspond to the individual electrodes 36Ca and 36Cb arranged in rows at the center of the first ceramic sheet 31, respectively. The conduction electrodes 42C and 42D have a rectangular shape in a plan view.

On the upper surface of the conduction-dummy ceramic sheet 33, conduction electrodes 44A, 44B for the common electrode (common-conduction electrodes 44A, 44B) are formed at positions along the short sides of the conduction-dummy ceramic sheet 33 respectively, namely at both end portions in the row direction of the common-conduction electrodes 42A to 42F. The common-conduction electrodes 44A, 44B are elongated in a direction orthogonal to the row direction of the conduction electrodes 42A to 42F, and are formed at positions at which the common-conduction electrodes 44A and 44B overlap with a part of the common electrode 37 (belt-like portions 37F, 37G) in each of the second ceramic sheets 32 and overlap with a part of the dummy common electrode 43 in each of the first ceramic sheets 31.

Figure 8:
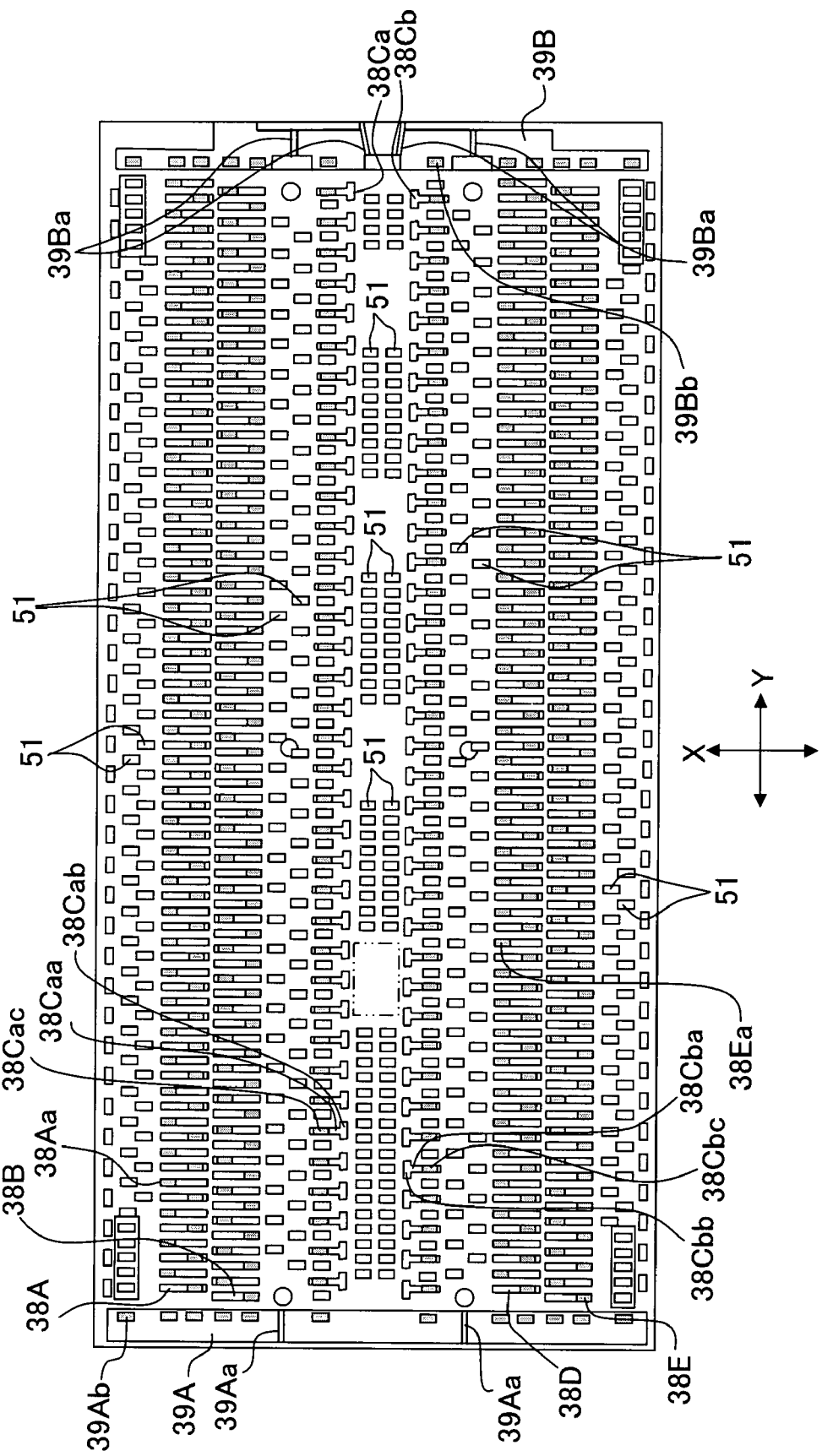
FIG. 8 is a plan view of a top ceramic sheet.

As shown in FIG. 8, on a surface of the top ceramic sheet 34, surface electrodes 38A, 38B, 38Ca, 38Cb, 38D, 38E for the individual electrodes (first surface electrodes; individual-surface electrodes 38A, 38B, 38Ca, 38Cb, 38D, 38E) are arranged in rows at positions corresponding to the conduction electrodes 42A to 42F of the dummy ceramic sheet 33 respectively. On the surface of the top ceramic sheet 34, surface electrodes 39A, 39B for the common electrode (second surface electrodes; common-surface electrodes 39A, 39B) are formed at both end portions in the row direction of the individual-surface electrodes 38A to 38E. The common-surface electrodes 39A and 39B are formed to be elongated in a direction orthogonal to the row direction of the individual-surface electrodes 38A to 38E.

The surface electrodes 38Ca, 38Cb located at the center on the top ceramic sheet 34 are formed in a T-shape (form of the alphabet letter "T") in a plan view, having first portions 38Caa, 38Cba extending in the X-direction and second portions 38Cab, 38Cbb connected to the inner end portions of the first portions 38Caa, 38Cba and extending in the Y-direction. The surface electrodes 38Ca, 38Cb are arranged in two rows in a staggered manner such that the surface electrodes 38Ca aligned in one row are shifted by half a pitch with respect to that for the surface electrodes 38Cb aligned in the other row. As indicated as hatched portions in FIG. 8, connection-electrode portions 38Cac, 38Cbc are formed on end portions of the second portions 38Cab, 38Cbb, respectively. The connection-electrode portions 38Cac, 38Cbc are connected to connection terminals of the flexible flat cable 4 which will be described later on.

The surface electrodes 38A, 38B, 38D and 38E located outside of the surface electrodes 38Ca, 38Cb have a linear shape in a plan view, and are arranged in a staggered manner such that surface electrodes belonging to a certain row is shifted from surface electrodes belonging to another row adjacent to the certain row by half a pitch at which the surface electrodes are aligned in each of the rows. As indicated by hatched portions in FIG. 8, connection-electrode portions 38Aa, 38Ba, 38Da and 38Ea are formed on end portions of the surface electrodes 38A, 38B, 38D and 38E, respectively. The connection-electrode portions 38Aa, 38Ba, 38Da and 38Ea are connected to connection terminals of the flexible flat cable 4 which will be described later on. Here, each of these connection-electrode portions is formed at any one of the both end portions of the surface electrode, so that the connection-electrode portions are located alternately at both ends in the row direction of the surface electrodes.

The surface electrodes 38A to 38E are arranged at positions above the partition walls 27 (see FIG. 3) each of which is arranged between mutually adjacent pressure chambers 18a among the pressure chambers 18. Here, the pressure chambers 18a are substantially parallel to the linear portion 36Aa to 36Ea of the individual electrodes 36A to 36E respectively, and are arranged at positions below the linear portions 36Aa to 36Ea respectively. Therefore, the individual electrodes 36A to 36E are arranged in rows at a pitch same as the pitch P for arranging the pressure chambers 18a in rows in the Y-direction, and the surface electrodes 38A to 38E are arranged to overlap in a plan view with the pressure chambers 18a respectively. On the other hand, although the surface electrodes 38A to 38E and the pressure chambers 18a are arranged in rows at a same pitch, the surface electrodes 38A to 38E and the pressure chambers 18a are arranged to be mutually shifted by half the pitch.

Each of the common-surface electrodes 39A, 39B is formed on the top ceramic sheet 34 to be elongated along one of the short sides of the top ceramic sheet 34. A plurality of slits 39Aa and a plurality of slits 39Ba are formed in the surface electrodes 39A, 39B respectively, and thus each of the surface electrodes 39A and 39B are divided into a plurality of electrode portions. The upper surface of the top ceramic sheet 34 is exposed at portions of the surface electrodes 39A, 39B at which the slits 39Aa, 39Ba are formed respectively. Further, as indicated by hatched portions in FIG. 8, at least one piece of conduction-electrode portion 39Ab in each of the divided electrode-portions of the surface electrode 39A, and at least one piece of conduction-electrode portion 39Bb is formed in each of the divided electrode-portions in the surface electrode 39B; and the conduction-electrode portions 39Ab and 39Bb are connected to connection terminals of the flexible flat cable 4.

When the piezoelectric actuator is calcinated as described above, the surface electrodes are also processed at a high temperature, which in turns lowers the joining performance of solder joining the surface electrodes and the connection terminals of the flexible flat cable 4. Therefore, the connection-electrode portions 38Aa, 38Ba, 38Cac, 38Cbc, 38Da, 38Ea, 39Ab, 39Bb formed of silver-based metallic material are adhered onto the surface electrodes formed of Ag—Pd based metallic material to thereby improve the joining performance between the surface electrodes and the connection terminals of the flexible flat cable 4.

The slits 39Aa, 39Ba are extended in a direction crossing the extending direction of the common-surface electrodes 39A, 39B. Note that, as shown in FIG. 10C, the slits 39Aa, 39Ba are formed on the top ceramic sheet 34 at positions different from those at which through holes 53B are arranged so as to secure the electrical connection by inner conductive electrodes 52B in the through holes 53B which will be described later on.

Each of the electrode-portions of the common-surface electrodes 39A and 39B divided by the slits 39Aa and 39Ba, respectively, has an area (dimension) of not more than a predetermined area. Therefore, when the plurality of ceramic sheets are calcinated to be integrated, it is possible to absorb the difference in the amount of thermal shrinkage generated between the top ceramic sheet 34 and the common-surface electrodes 39A, 39B. Namely, the length in the Y-direction of each of the electrode portions is shorter than the entire length in the Y direction of each of the surface electrodes 39A and 39B, and thus the difference in the amount of thermal shrinkage between each of the electrode portions and the portion of the top ceramic sheet 34 overlapping with each of the electrode portions is reduced. Namely, it is possible to absorb the difference in the amount of thermal shrinkage between the top ceramic sheet 34 and the common-surface electrodes 39A, 39B.

A plurality of dummy electrodes 51, which do not contribute to the electrical conduction, are provided in a regular manner between the rows of the surface electrodes 38Ca and 38Cb. The dummy electrodes 51 are also arranged on the top ceramic sheet 34 at a portion between the surface electrodes 38B and 38Ca; at a portion between the surface electrodes 38Cb and 38D; and at portions outside the surface electrodes 38A and 38E respectively.

The arrangement of the dummy electrodes 51 is not limited to that shown in FIG. 8. It is enough that the dummy electrodes 51 described above are arranged in a balanced manner at positions at which the surface electrodes are arranged respectively, so as to prevent the joining force from lowering when the respective sheets are pressed to be integrated.

As shown in FIG. 4, the common electrode 71 is formed entirely on the upper surface of the third ceramic sheet 35.

Figure 10A:
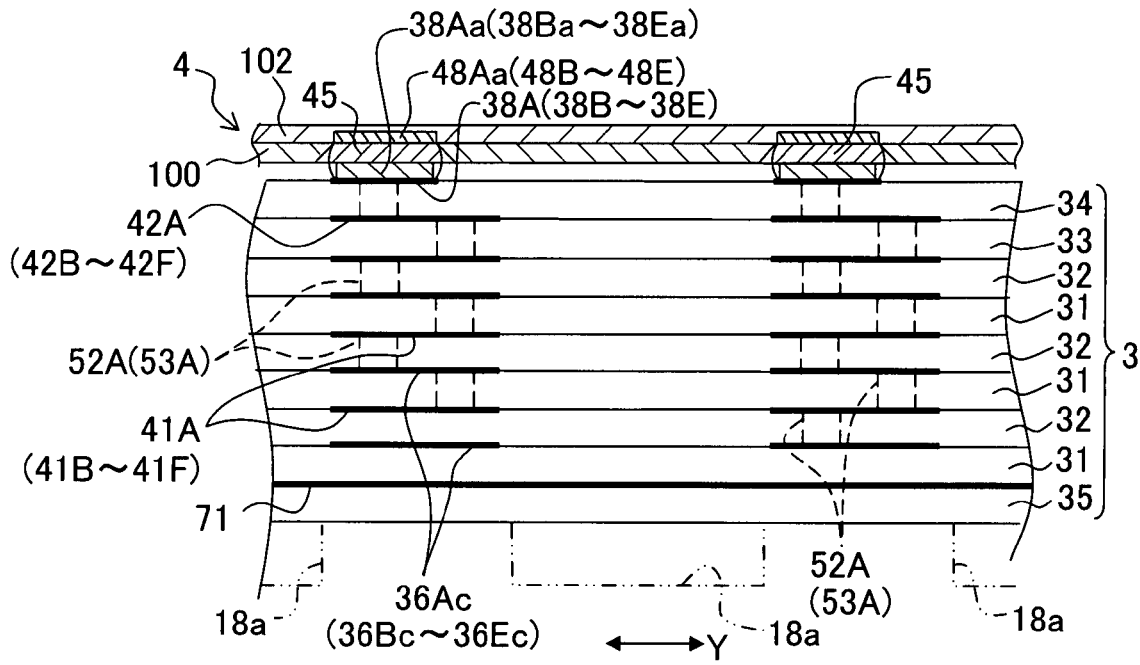
FIG. 10A is a sectional view for explaining the conduction relationship from individual electrodes to surface electrodes.
Figure 10B:
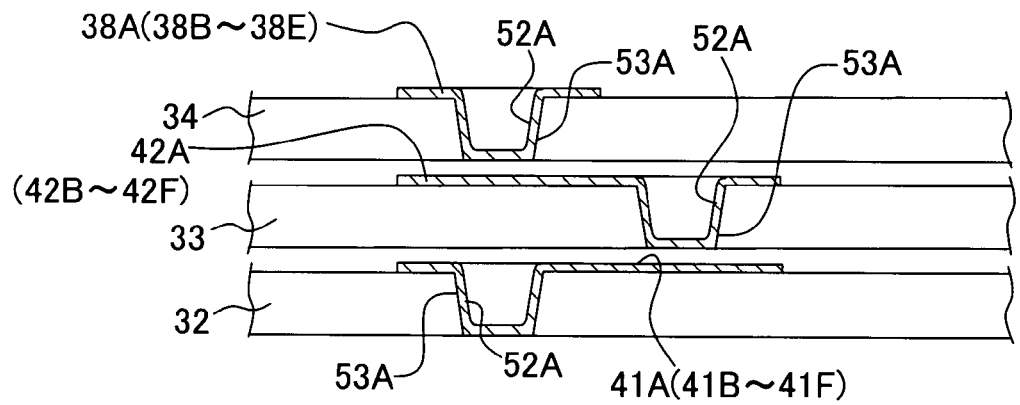
FIG. 10B is a view for explaining through holes.
Figure 10C:
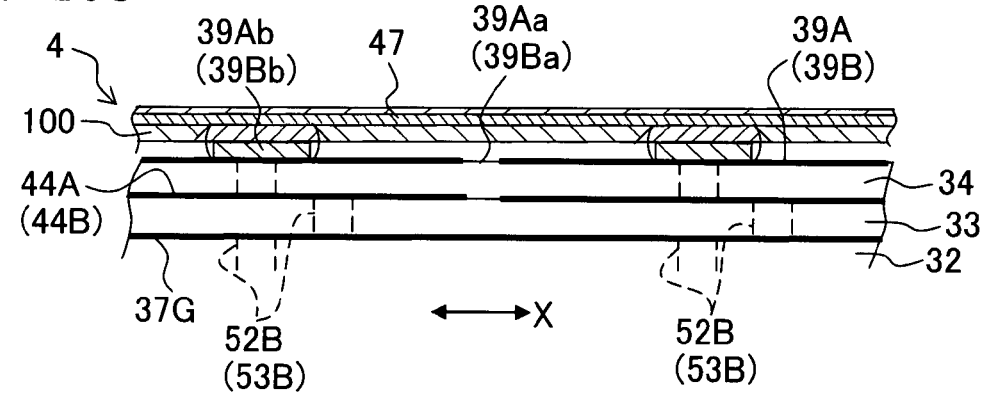
FIG. 10C is a sectional view for explaining the conduction relationship from common electrodes to surface electrodes.
Figure 11:
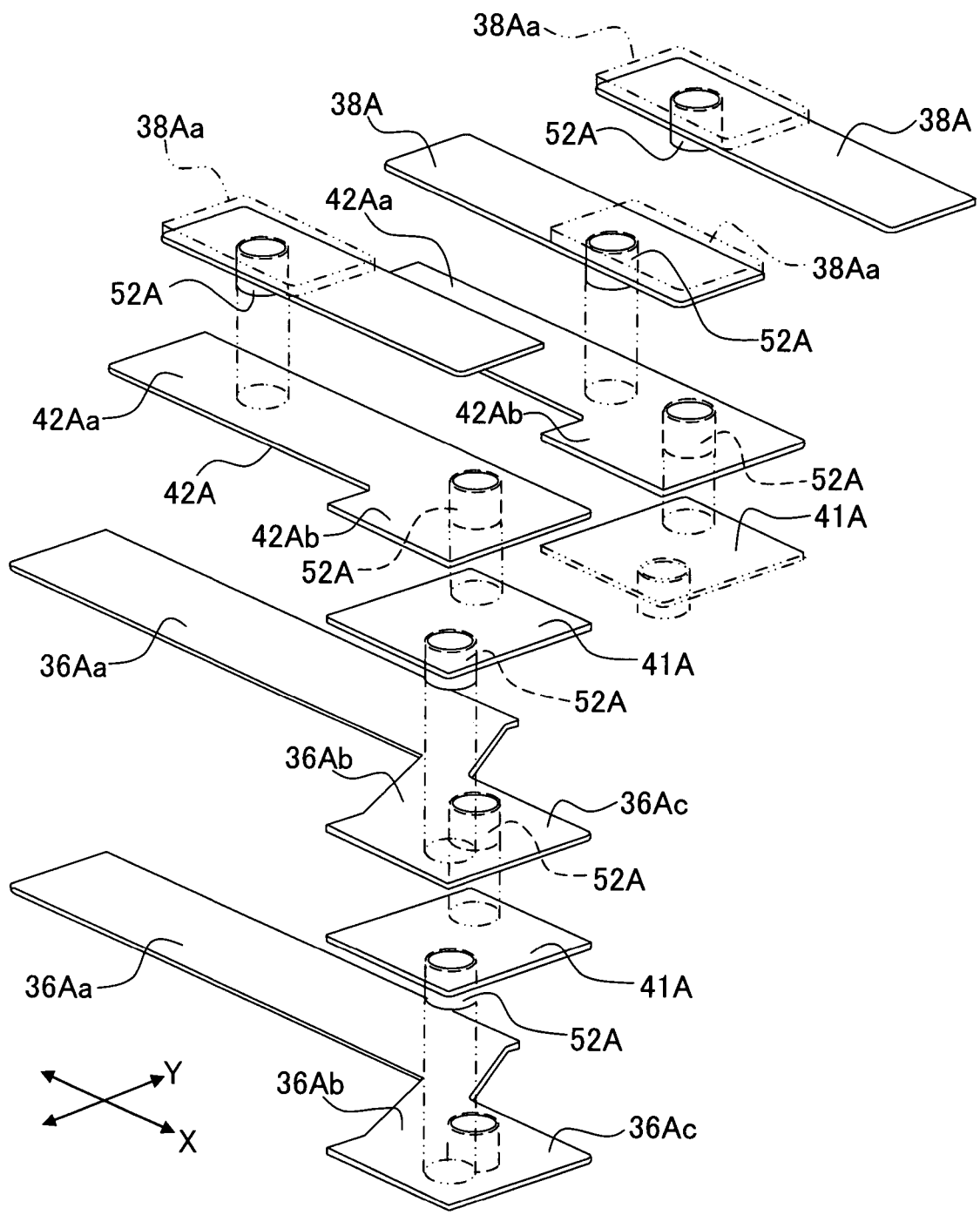
FIG. 11 is a perspective view for explaining the conduction relationship from the individual electrodes to the surface electrodes.

Unlike the third ceramic sheet 35 as the lowermost layer in the actuator, the first and second ceramic sheets 31 and 32, the conduction-dummy sheet 33, and the top ceramic sheet 34 are provided with a plurality of through holes 53A, 53B, as shown in FIGS. 10A and 10B. The through holes 53A and 53B penetrate through the sheets 31 to 34 in the thickness direction thereof, and an electrically conductive paste is filled in the inside of the through holes 53A and 53B to form inner electrodes 52A, 52B therein respectively. Further, as shown in FIG. 11, the surface electrodes 38A to 38E, the conduction portions 36Ac to 36Ec of the individual electrodes 36A to 36E, the conduction electrodes (dummy-individual electrodes) 41A to 41F and the conduction electrodes 42A to 42F are electrically connected to one another via the inner conduction electrodes 52A formed inside the through holes 53A in the ceramic sheets 31, 32, 33 and 34.

Furthermore, the plurality of through holes 53B penetrating through the piezoelectric ceramic sheets 31 to 34 in the thickness direction thereof are formed at positions corresponding to the electrodes 39A, 39B, 37, 71, 43, 44A and 44B respectively. Inside the through holes 53B, an electrically conductive material (electrically conductive paste) is filled to form inner conduction electrodes 52B. As shown in FIG. 10C, the inner conduction electrodes 52B electrically connect the common-surface electrodes 39A and 39B, the common electrode 37 (first belt-like portions 37A to 37E) and the common electrode 71; and the inner conduction electrodes 52B electrically connect the dummy-common electrode 43 and the common-conduction electrodes 44A and 44B.

The inner conduction electrodes 52A and the inner conduction electrodes 52B are formed in the ceramic sheets such that positions, at which the inner conduction electrodes 52A and 52B are formed in a certain ceramic sheet respectively, do not overlap in a plan view with positions at which the inner conduction electrodes 52A and 52B are formed in another certain ceramic sheets adjacent to the certain ceramic sheet (sandwiching the certain ceramic sheet) in the up and down direction. As shown in FIGS. 10B and 11, the through holes 53A, 53B are formed in the conduction dummy sheet 33 at positions which are shifted by a predetermined distance from positions at which the through holes 53A, 53B are formed in the top ceramic sheet 34. The through holes 53A, 53B are formed in the green sheets as the material for the ceramic sheets, and then the conductive material is coated on surfaces of the green sheets by the screen printing or the like. At this time, the conductive material is flowed into the through holes 53A, 53B to form the inner conductive electrodes 52A, 52B respectively. Therefore, as shown in FIG. 10B, each of the inner conductive electrodes 52A, 53B is formed in a hollow shape opening on the side of the upper surface of the green sheet. Since the through holes are formed such that the through holes formed in two layers of the ceramic sheets adjacent in the up and down direction are located at positions which do not overlap with one another. Therefore, it is possible to avoid a situation in which through holes formed in the upper layer sheet are coaxially overlapped with through holes formed in the lower layer sheet, which would otherwise decrease contacting areas for the inner conduction electrodes 52A, 52B. Namely, by forming the two through holes to be shifted from each other, it is possible to make the bottom portions of the inner conduction electrodes 52A, 52B, formed to have a cup-shape in the upper layer sheet to have a surface-to-surface contact with the flat-shaped electrodes 42A (41A) formed on the lower layer sheet, thereby ensuring the electric conduction between the upper and lower layer sheets.

Figure 9:
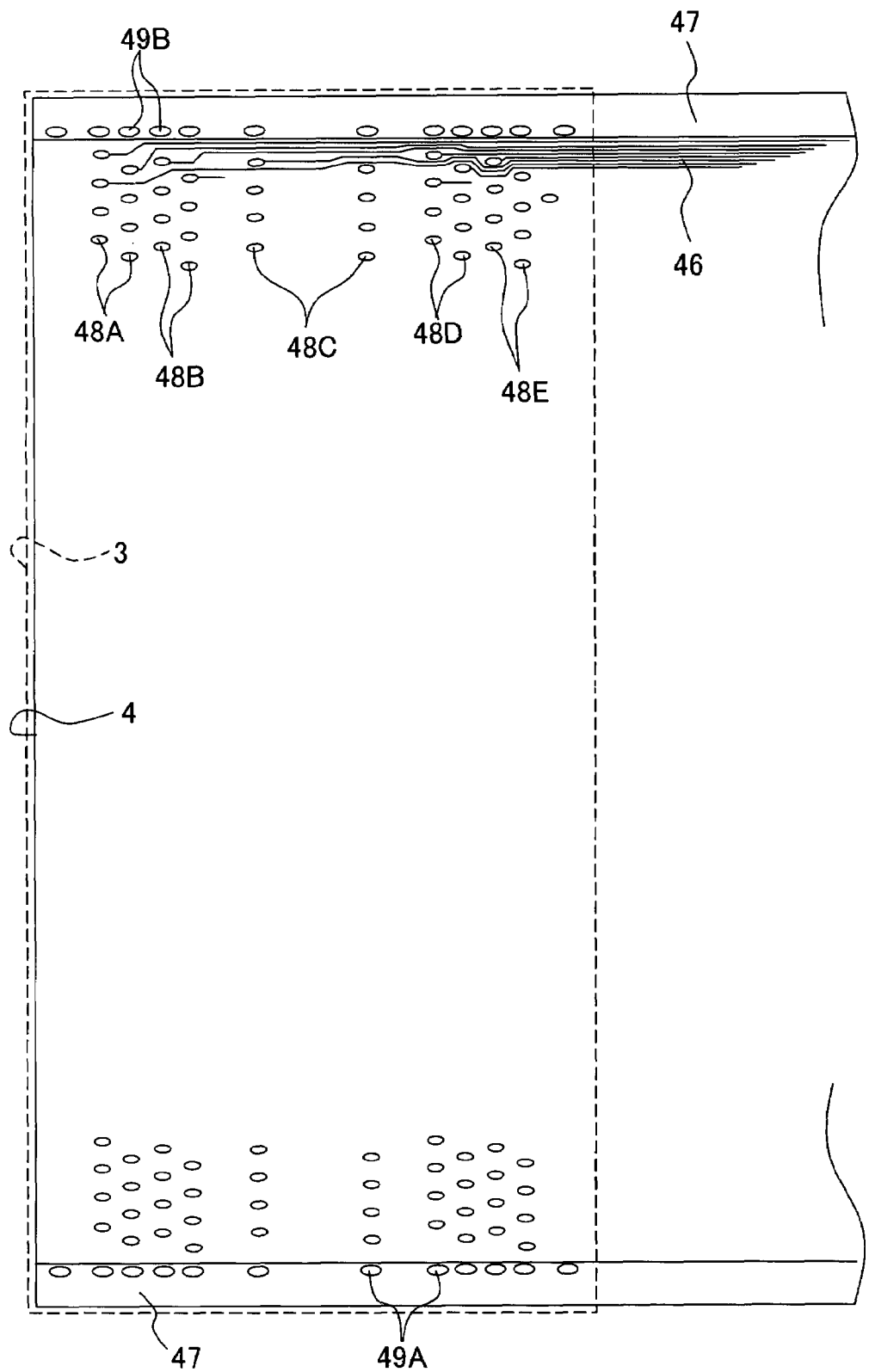
FIG. 9 is a plan view for explaining electrode arrangement in the flexible flat cable.

As shown in FIG. 1, the flexible flat cable 4 is overlaid with the upper surface of the top ceramic sheet 34 and arranged to be project outwardly from the top ceramic sheet 34 in a direction orthogonal to the nozzle rows (X-direction). The flexible flat cable 4 includes a belt-like shaped base member 100 made of flexible synthetic resin material having insulating property (for example, polyimide resin, polyester resin, polyamide resin, or the like); connection terminals 48A, 48B, 48C, 48D and 48E which are made of copper foil and which are formed on a surface of the base member 100 to correspond to the individual-connection-electrode portions 38Aa to 38Ea respectively; and fine wirings 46 connected to the connection terminals 48A to 48E. Further, as shown in FIG. 9, connection terminals 49A, 49B are formed in the flexible flat cable 4 at positions overlapping with the conduction-electrode portion 39Ab, 39Bb respectively; and wirings 47 for the common electrodes which are connected to the connection terminals 49A, 49B respectively are provided on the flexible flat cable along the both ends of the flexible flat cable 4. The wirings 47 are belt-like shaped and have a width greater than that of the wirings 46. These connection terminals and wirings are formed by the photoresist method or the like, and as shown in FIG. 10C, the surfaces of these terminals and wirings are covered by a cover lay 102 made of a flexible synthetic resin material having insulating property (for example, polyimide resin, polyester resin, polyamide resin, or the like).

The connection terminals 48A to 48E, 49A and 49B are exposed from the base member 100, and are joined to the connection-electrode portions 38Aa to 38Ea, 39Ab and 39Bb, respectively, with an electrically conductive brazing material (for example, solder) 45. The electrode-portions of each of the common-conduction electrode portions 39Ab, 39Bb divided along either side of the actuator, is joined to one of the common-wirings 47 formed continuously along both sides of the flexible flat cable 4. Namely, since the common electrodes are joined to the wirings 47 for the common electrodes having a broad width at a plurality of points or locations, it is possible to concurrently conduct a large number of the individual electrodes. Further, the wirings 47 are electrically joined to a driving integrated circuit 101 provided on the base member 101, thereby making it possible to selectively supply driving signals to the piezoelectric actuator.

Portions of the ceramic sheets 31 and 32, between the individual electrodes 36A to 36E and the common electrodes 37, 71 in the stacking direction, function as active portions (energy generating mechanism). Namely, when the voltage is applied to portions (active portions) of the ceramic sheets between desired individual electrodes 36A to 36E and the common electrodes 37, 71, the active portions therebetween are displaced to impart jetting pressure to the ink in a certain pressure chamber 18a, among the pressure chambers 18a, corresponding to the desired active portions, thereby making an ink droplet jetted from a certain nozzle 11a among the nozzles 11a corresponding to the certain pressure chamber 18a.

Such active portions (energy-generating mechanism) correspond to the pressure chambers 18a and are formed in the ceramic sheets at positions overlapping with the pressure chambers 18a respectively. Namely, the active portions are arranged in the row direction of the nozzles 11a (pressure chambers 18a), i.e. in the Y-direction, and are aligned in the X-direction in rows in a number same as that of the rows of the nozzles 11a (five rows in the embodiment). Further, the active portions are each formed to be elongated in the longitudinal direction of the pressure chamber 18a. The active portions are arranged in a staggered manner at spacing distances (intervals) same as those for the pressure chambers 18a.

Figure 12A:
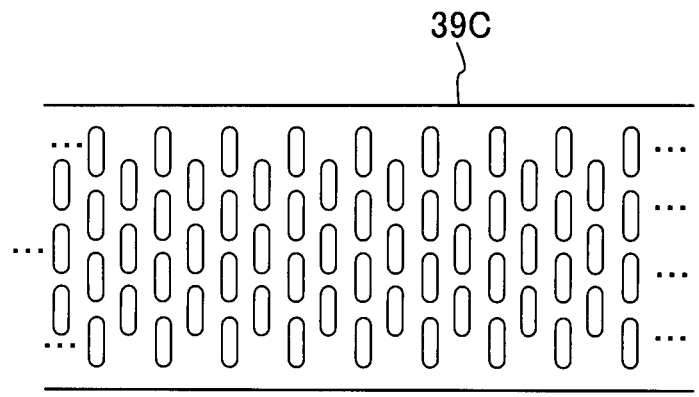
FIGS. 12A to 12C are each showing a modification to the shape of a surface electrode for the common electrode (common-surface electrode; second surface electrode)
Figure 12B:
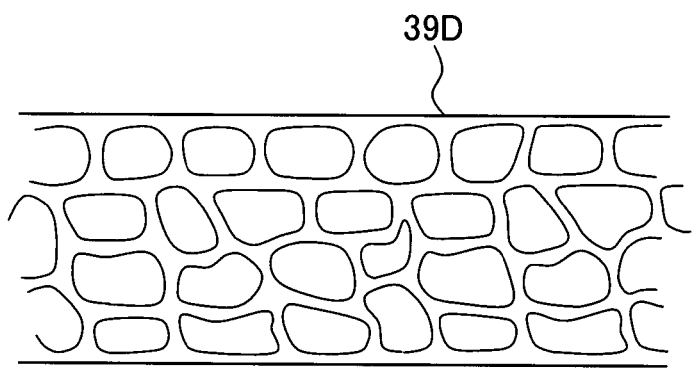
Figure 12C:
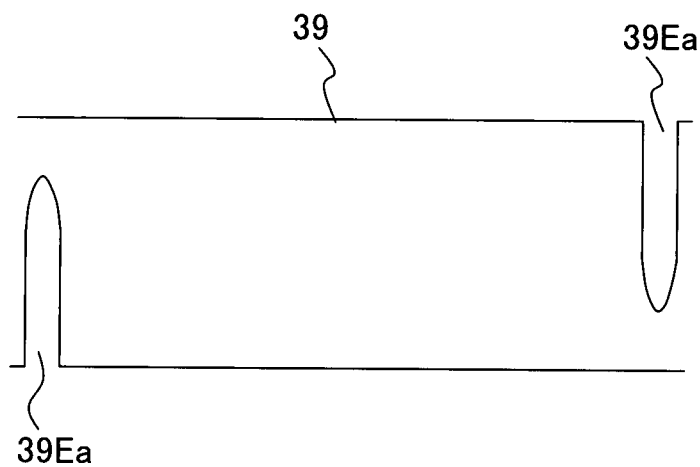

In the above-described embodiment, the slits are formed in each of the extending common-surface electrodes respectively such that the slits extending in a direction crossing the extending direction of the common-surface electrodes, to thereby expose the upper surface of the top ceramic sheets in the slits. However, the present invention is not limited to the above construction. For example, as shown in FIG. 12A, it is possible to use a surface electrode 39C for the common electrode having a large number of through holes from which the upper surface of the top ceramic sheet 34 is exposed. As shown in FIG. 12B, it is also possible to use a surface electrode 39D for the common electrode which is net-shaped and in which the upper surface of the top ceramic sheet 34 is exposed in the mesh of the net. Further, as shown in FIG. 12C, it is allowable that slits 39Ea of a surface electrode 39E for the common electrode do not cross the electrode portions completely.

In the above-described embodiment, the number of the individual electrodes and the number of the surface electrodes for the individual electrodes may be set in any manner provided that the numbers each corresponds to the number of the pressure chambers. In the embodiment, although the surface of the top ceramic sheet is exposed by the slits or the like formed in the surface electrodes for the common electrode, it is also allowable that the surface of the top ceramic sheet is covered by a protective film or the like so as not to expose the surface of the top ceramic sheet directly.

Figure 13:
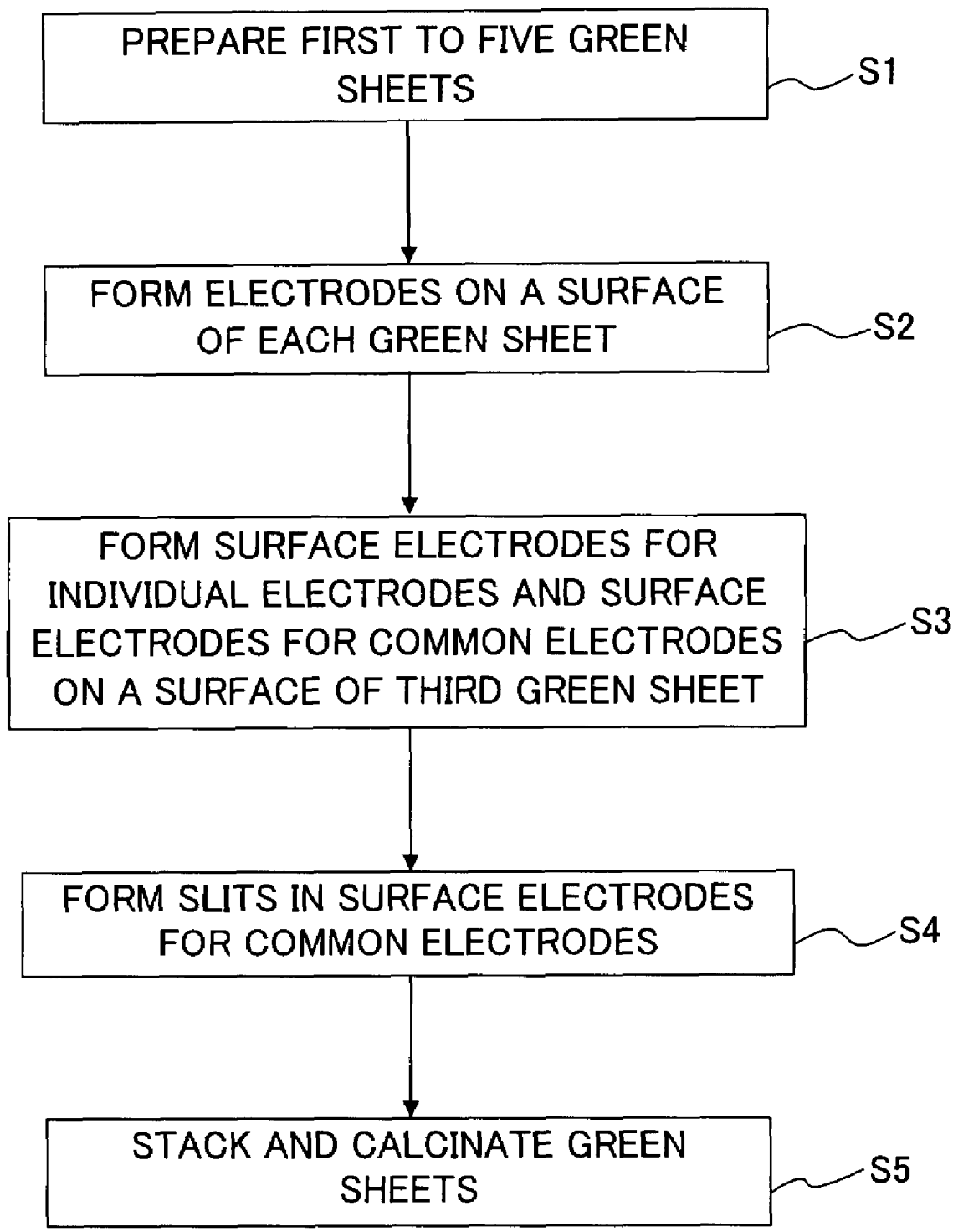
FIG. 13 is a flow chart explaining a method for producing a piezoelectric actuator of the present invention.

Next, a method for producing the piezoelectric actuator 3 of the above-described embodiment will be briefly explained with reference to FIG. 13. First, first and second green sheets which are to be the first and second ceramic sheets 31, 32 respectively, a third green sheet which is to be the top ceramic sheet 34, a fourth green sheet which is to be the conduction-dummy ceramic sheet 33, and a fifth green sheet which is to be the third ceramic sheet 35 are prepared (S1). Next, the predetermined electrodes are formed on the surface of each of the green sheets by the screen printing or the like (S2). Here, each of the electrodes is formed of an Ag—Pd based conductive material as described above.

Surface electrodes for the individual electrodes, corresponding to the individual electrodes formed on the surface of the first green sheet, are formed on the surface of the third green sheet; and further, surface electrodes for the common electrode are formed on the third green sheet at both ends in the longitudinal direction thereof, to extend along the short side thereof (S3). Afterwards, a plurality of slits is formed in the surface electrodes for the common electrode to expose the surface of the third green sheet in the slits (S4). Next, the green sheets are stacked and calcinated (S5), thereby producing the piezoelectric actuator.

As described above, since the stacked green sheets are calcinated in a state that the slits, at which the upper surface of the top green sheet are exposed, is formed in the surface electrodes for the common electrode, the difference in the amount of thermal shrinkage between the elongated (extending) surface electrodes for the common electrodes and the top green sheet generated in the elongating direction of the surface electrodes for the common electrodes can be lowered by the slits, thereby absorbing the difference in the amount of thermal shrinkage generated between the surface electrodes for the common electrode and the top green sheet. Therefore, it is possible to suppress the arching deformation in the top green sheet, with the portions on the top green sheet at which the surface electrodes for the common electrodes are formed as the valley of the arching deformation, thereby making it possible to secure a predetermined flatness.

Note that the slits formed in the surface electrodes for the common electrode may also be formed by removing the material for the electrodes by, for example, irradiating laser beam after the formation of the electrodes. Alternatively, the slits may be formed concurrently with the electrode formation.

What is claimed is:

1. A piezoelectric actuator in which a plurality of stacked ceramic sheets are calcinated to be integrated, comprising:
   a first ceramic sheet on which a first electrode is formed;
   a second ceramic sheet which is stacked on the first ceramic sheet and on which a second electrode is formed; and
   a top ceramic sheet which is rectangular elongated in a predetermined direction and stacked above the first and second ceramic sheets and on which a first surface electrode corresponding to the first electrode and a second surface electrode corresponding to the second electrode are formed, the second surface electrode extending, at an end portion in the predetermined direction of the top ceramic sheet, in a direction orthogonal to the predetermined direction;
   wherein a plurality of slits are formed in the second surface electrode to divide the second surface electrode into a plurality of electrode portions.

2. The piezoelectric actuator according to claim 1,
   wherein an upper surface of the top ceramic sheet is exposed at portions, of the second surface electrode, at which the slits are formed.

3. The piezoelectric actuator according to claim 1,
   wherein the piezoelectric actuator is joined to a cavity unit including a plurality of nozzle rows each of which has a plurality of nozzles for jetting liquid-droplets of a liquid and a plurality of pressure-chamber rows each of which has a plurality of pressure chambers corresponding to the nozzles respectively; and
   wherein the first electrode has a plurality of individual electrodes arranged to correspond to the pressure chambers respectively, and the second electrode has a common electrode arranged commonly for the pressure chambers.

4. The piezoelectric actuator according to claim 1,
   wherein a plurality of through holes are formed in the first, second and top ceramic sheets respectively, the through holes penetrating through the first, second and top ceramic sheets respectively in a stacking direction thereof;
   wherein an electrically conductive paste is filled in the through holes to electrically connect the second electrode and the second surface electrode in the stacking direction; and
   wherein portions, of the second surface electrode, at which the slits are formed respectively do not overlap with a through hole, among the through holes, which is formed in the top ceramic sheet.

5. The piezoelectric actuator according to claim 1,
   wherein the first electrode has a plurality of individual electrodes arranged in a plurality of rows;
   the second electrode faces the individual electrodes in a stacking direction of the first, second and top ceramic sheets and extends in a row direction of the individual electrodes;
   wherein the first surface electrode has a plurality of first surface electrodes arranged in a plurality of rows corresponding to the individual electrodes, respectively; and
   wherein the second surface electrode is formed on the top ceramic sheet at an edge portion in a row-extending direction in which the rows of the first surface electrodes extend, the second surface electrode extending in a row-arrangement direction in which the rows of the first surface electrodes are arranged.

6. The piezoelectric actuator according to claim 1, wherein the slits extend in a crossing direction crossing an extending direction of the second surface electrode.

7. The piezoelectric actuator according to claim 1,
wherein the first, second and top ceramic sheets are formed of lead zirconate titanate; and
wherein the first and second electrodes and the first and second surface electrodes conducted to the first and second electrodes respectively are formed by performing screen printing with an electrically conductive paste containing a silver-palladium based metallic material.

8. A piezoelectric actuator in which a plurality of stacked ceramic sheets are calcinated to be integrated, the actuator comprising:
a first ceramic sheet on which a first electrode is formed;
a second ceramic sheet which is stacked on the first ceramic sheet and on which a second electrode is formed; and
a top ceramic sheet which is rectangular and stacked above the first and second ceramic sheets and on which a first surface electrode corresponding to the first electrode and a second surface electrode corresponding to the second electrode are formed, the second surface electrode extending, at an end portion in a longitudinal direction of the top ceramic sheet, in a direction orthogonal to the predetermined direction;
wherein a plurality of through holes are formed in the second surface electrode.

9. The piezoelectric actuator according to claim 8, wherein an upper surface of the top ceramic sheet is exposed at portions, of the second surface electrode, at which the through holes are formed.

10. The piezoelectric actuator according to claim 8,
wherein the piezoelectric actuator is joined to a cavity unit including a plurality of nozzle rows each of which has a plurality of nozzles for jetting liquid-droplets of a liquid and a plurality of pressure-chamber rows each of which has a plurality of pressure chambers corresponding to the nozzles respectively; and
wherein the first electrode has a plurality of individual electrodes arranged corresponding to the pressure chambers respectively, and the second electrode has a common electrode arranged commonly for the pressure chambers.

11. The piezoelectric actuator according to claim 8,
wherein a plurality of through holes are formed in the first, second and top ceramic sheets respectively, the through holes penetrating through the first, second and top ceramic sheets respectively in a stacking direction thereof;
wherein an electrically conductive paste is filled in the through holes to electrically connect the second electrode and the second surface electrode in the stacking direction; and
wherein portions, of the second surface electrode, at which the through holes are formed respectively do not overlap with a through hole formed in the top ceramic sheet among the through holes.

12. The piezoelectric actuator according to claim 8,
wherein the first electrode has a plurality of individual electrodes arranged in a plurality of rows;
wherein the second electrode faces the individual electrodes in a stacking direction of the first, second and top ceramic sheets and is extended in a row direction of the individual electrodes;
wherein the first surface electrode has a plurality of first surface electrodes arranged in a plurality of rows corresponding to the individual electrodes, respectively; and
wherein the second surface electrode is formed on the top ceramic sheet at an edge portion in a row-extending direction in which the rows of the first surface electrodes extend, the second surface electrode extending in a row-arrangement direction in which the rows of the first surface electrodes are arranged.

13. The piezoelectric actuator according to claim 8,
wherein the first, second and top ceramic sheets are formed of lead zirconate titanate; and
wherein the first and second electrodes and the first and second surface electrodes conducted to the first and second electrodes respectively are formed by performing screen printing with an electrically conductive paste containing a silver-palladium based metallic material.

* * * * *